(12) United States Patent
Kageyama (10) Patent No.: US 8,125,050 B2
(45) Date of Patent: Feb. 28, 2012

(54) SEMICONDUCTOR DEVICE HAVING A MIM CAPACITOR AND METHOD OF MANUFACTURING THE SAME

(75) Inventor: Satoshi Kageyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 145 days.

(21) Appl. No.: 12/155,229

(22) Filed: May 30, 2008

(65) Prior Publication Data

US 2009/0032953 A1 Feb. 5, 2009

(30) Foreign Application Priority Data

May 31, 2007 (JP) ................................ 2007-145810

(51) Int. Cl.
*H01L 29/00* (2006.01)
(52) U.S. Cl. ........ 257/534; 257/301; 257/306; 257/532; 438/386
(58) Field of Classification Search .................. 257/531, 257/301, 306, 532, 534; 438/386
See application file for complete search history.

(56) References Cited

U.S. PATENT DOCUMENTS

| 6,168,991 B1* | 1/2001 | Choi et al. ..................... 438/254 |
| 6,320,244 B1* | 11/2001 | Alers et al. ..................... 257/534 |
| 2003/0067053 A1 | 4/2003 | Hori et al. |
| 2006/0009065 A1* | 1/2006 | Lee et al. ..................... 439/395 |
| 2007/0246799 A1* | 10/2007 | Kawano ........................ 257/532 |

FOREIGN PATENT DOCUMENTS

| JP | 2002-184953 | 6/2002 |
| KR | 2002-0055887 | 7/2002 |

* cited by examiner

*Primary Examiner* — Howard Weiss
*Assistant Examiner* — Tifney Skyles
(74) *Attorney, Agent, or Firm* — Rabin & Berdo, PC (57) ABSTRACT

A semiconductor device is described includes a wiring layer, an insulating layer stacked on the wiring layer, a trench formed by digging down the insulating layer from the surface thereof, a film-shaped lower electrode formed along the inner surface of the trench, a capacitor film formed along the surface of the lower electrode, and an upper electrode opposed to the lower electrode with the capacitor film sandwiched therebetween.

16 Claims, 7 Drawing Sheets

SEMICONDUCTOR DEVICE HAVING A MIM CAPACITOR AND METHOD OF MANUFACTURING THE SAME

BACKGROUND OF THE INVENTION

1. Field of the Invention

The present invention relates to a semiconductor device including a capacitor having an MIM (Metal-Insulator-Metal) structure and a method of manufacturing the same.

2. Description of Related Art

A capacitor (hereinafter referred to as "MIM capacitor") having a structure (MIM structure) obtained by sandwiching an insulating capacitor film between a lower electrode and an upper electrode exhibits a small resistive component, and can be increased in capacitance density. Therefore, the MIM capacitor has drawn attention particularly as a capacitor loaded on a system LSI for a radio communication.

While the lower electrode and the upper electrode of the MIM capacitor are generally formed by metal films containing Al (aluminum), it is attempted to apply Cu (copper) having higher conductivity than Al to the material for the lower electrode in place of Al, in order to further reduce the resistance.

Figure 3:
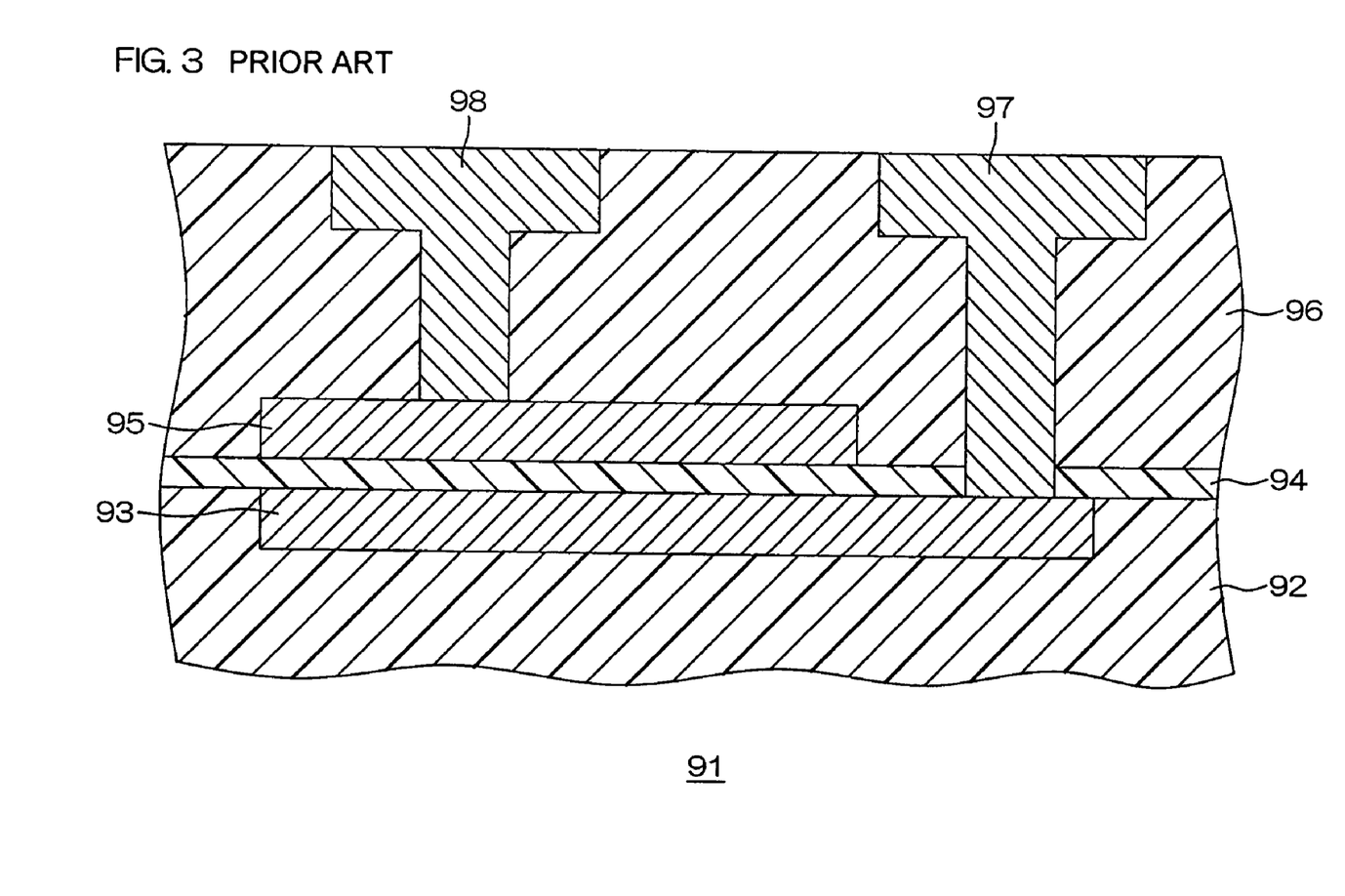
FIG. 3 is a sectional view schematically showing the structure of a conventional semiconductor device.

FIG. 3 is a schematic sectional view of an MIM capacitor employing Cu as the material for a lower electrode.

This MIM capacitor 91 is formed on a semiconductor substrate (not shown) through an interlayer insulating film 92. A lower electrode 93 made of Cu is embedded in a trench formed on the surface layer portion of the interlayer insulating film 92 by the so-called damascene process. The surface of the lower electrode 93 is generally flush with the surface of the interlayer insulating film 92, and a capacitor film 94 made of SiN (silicon nitride), for example, is stacked on the surfaces of the interlayer insulating film 92 and the lower electrode 93. An upper electrode 95 is made of TiN (titanium nitride), for example, is in the form of a flat plate smaller in size than the lower electrode 93 in plan view, and is opposed to the lower electrode 93 with the capacitor film 94 sandwiched therebetween.

Another interlayer insulating film 96 is stacked on the capacitor film 94 and the upper electrode 95. A lower electrode contact plug 97 and an upper electrode contact plug 98 are provided to penetrate the interlayer insulating film 96 in the thickness direction. The lower electrode contact plug 97 further penetrates the capacitor film 94, and the lower end thereof is connected to the lower electrode 93. The lower end of the upper electrode contact plug 98 is connected to the upper electrode 95.

In a semiconductor device loaded with an MIM capacitor having such a structure, however, the MIM capacitor occupies a wide area on a semiconductor substrate, to hinder downsizing of the semiconductor device.

SUMMARY OF THE INVENTION

An object of the present invention is to provide a semiconductor device and a method of manufacturing the same capable of reducing an area occupied by an MIM capacitor.

An aspect of the present invention provides a semiconductor device including a wiring layer, an insulating layer stacked on the wiring layer, a trench formed by digging down the insulating layer from the surface thereof, a film-shaped lower electrode formed along the inner surface of the trench, a capacitor film formed along the surface of the lower electrode, and an upper electrode opposed to the lower electrode with the capacitor film sandwiched therebetween.

According to this structure, the trench is formed in the insulating layer provided on the wiring layer by digging down the insulating layer from the surface thereof. The film-shaped lower electrode is formed along the inner surface of the trench, and the capacitor film is formed along the surface of the lower electrode. The upper electrode opposed to the lower electrode with the capacitor film sandwiched therebetween is provided on the capacitor film. Thus, the semiconductor device includes an MIM capacitor formed by sandwiching the capacitor film between the lower electrode and the upper electrode.

In this MIM capacitor, the lower electrode and the capacitor film are formed along the inner surface of the trench, and the area (opposed area) of the opposed portions of the lower electrode and the upper electrode are larger than the area occupied by the trench. As compared with an MIM capacitor including a lower electrode and an upper electrode in the form of parallel flat plates, therefore, the same capacitance can be ensured with a smaller occupied area (plane size). Therefore, the area occupied by the MIM capacitor can be reduced in the semiconductor device.

Contact wiring may be embedded in the surface layer portion of the wiring layer, on a position opposed to the trench. The insulating layer may be provided with a via hole penetrating the bottom surface of the trench and the surface of the contact wiring. In this case, the lower electrode is formed along not only the inner surface of the trench, but also portions of the side surface of the via hole and the surface of the contact wiring facing the trench.

Thus, the opposed area of the lower electrode and the upper electrode can be further increased, and the area occupied by the MIM capacitor can be further reduced (in other words, the capacitance of the MIM capacitor can be further increased). Further, the lower electrode is in contact with the contact wiring, whereby power can be supplied to the lower electrode through the contact wiring.

The upper electrode may be made of a metal containing copper, and may fill up the trench. In this case, the lower electrode is preferably made of a material having barrier properties against diffusion of copper into the insulating layer.

The upper electrode made of the metal containing copper can be formed to fill up the trench provided with the lower electrode and the capacitor film by the so-called damascene process. If the lower electrode has barrier properties against diffusion of copper when the upper electrode is made of the metal containing copper, copper contained in the metal constituting the upper electrode can be prevented from diffusing into the insulating layer.

The wiring layer may include lower wiring embedded in the surface layer portion thereof. The semiconductor device may further include upper wiring embedded in the insulating layer and connected to the lower wiring.

The contact wiring can be formed in parallel with the formation of the lower wiring. The upper electrode can be formed in parallel with the formation of the upper wiring. In other words, the MIM capacitor can be formed in parallel with the formation of a wiring structure constituted of the lower wiring and the upper wiring. Therefore, the MIM capacitor can be formed without increasing the number of the manufacturing steps.

The semiconductor device including the wiring structure constituted of the lower wiring and the upper wiring can be obtained by the following method: The method of manufacturing this semiconductor device includes the steps of: stacking an insulating layer on a wiring layer having contact wiring and lower wiring embedded in a surface layer portion thereof;

forming a first trench and a second trench on a position opposed to the contact wiring and a position opposed to the lower wiring respectively by digging down the insulating layer from a surface thereof; forming a metal film on inner surfaces of the first trench and the second trench and a surface of the insulating layer after the trench forming step; forming a capacitor film at least on the metal film in the first trench; forming a conductive material layer by depositing a conductive material on the metal film and the capacitor film to fill up the first trench and the second trench; and removing portions of the conductive material layer and the metal film outside the first trench and the second trench.

The foregoing and other objects, features and effects of the present invention will become more apparent from the following detailed description of the embodiments with reference to the attached drawings.

DETAILED DESCRIPTION OF PREFERRED EMBODIMENTS

Embodiments of the present invention are now described in detail with reference to the accompanying drawings.

Figure 1:
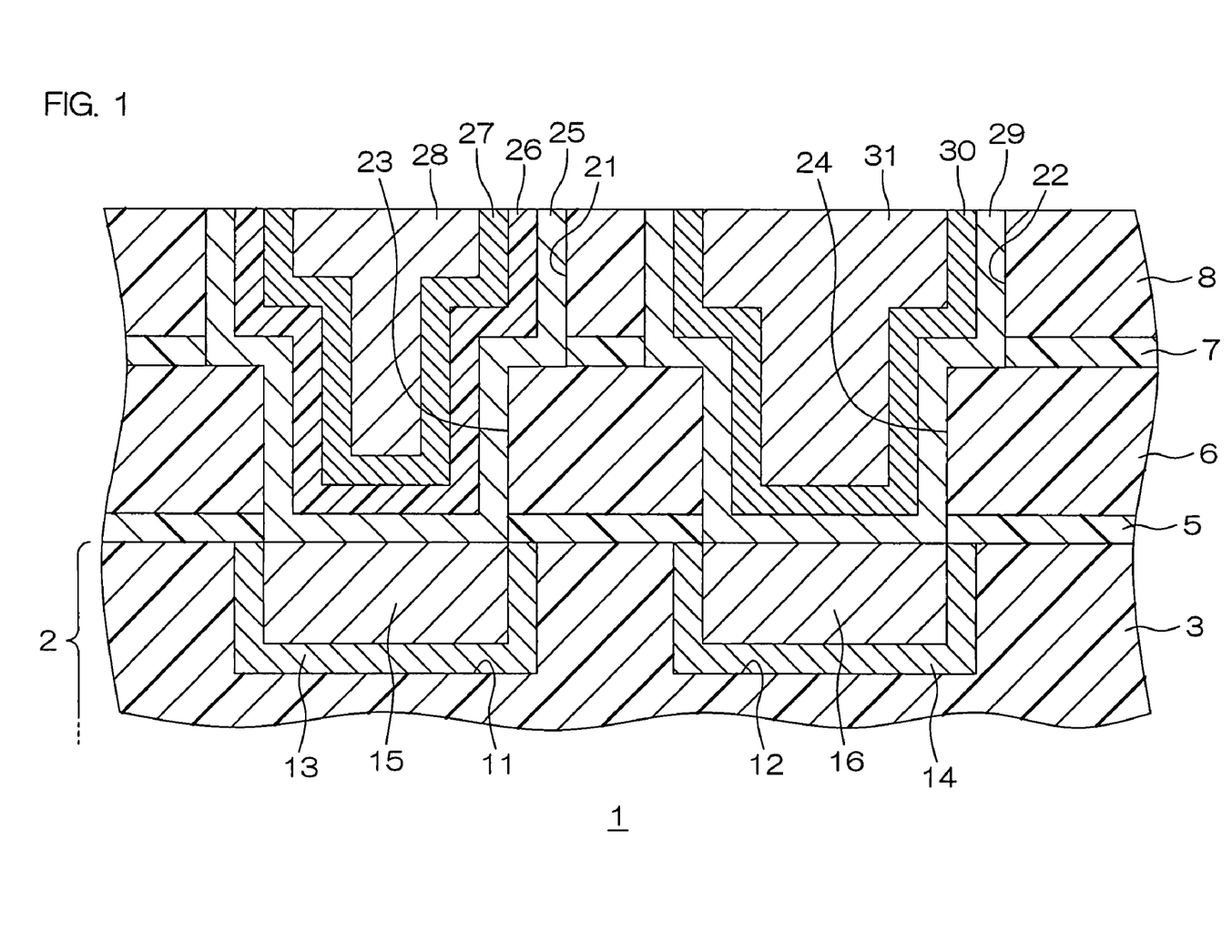
FIG. 1 is a sectional view schematically showing the structure of a semiconductor device according to an embodiment of the present invention.

FIG. 1 is a sectional view schematically showing the structure of a semiconductor device according to an embodiment of the present invention.

This semiconductor device 1 includes a semiconductor substrate (not shown) serving as the base thereof and a wiring layer 2 formed on the semiconductor substrate.

The semiconductor substrate is formed by a silicon substrate, for example. A functional element such as MOSFET (Metal Oxide Semiconductor Field-Effect Transistor) is provided on the surface layer portion of the semiconductor substrate.

The wiring layer 2 includes a first insulating film 3. Examples of the material for the first insulating film 3 include Low-k film materials such as SiOC (carbon-doped silicon oxide) and SiOF (fluorine-doped silicon oxide), in addition to $SiO_2$ (silicon oxide).

Trenches 11 and 12 are formed on the surface layer portion of the first insulating film 3 at an interval from each other. The inner surfaces of the trenches 11 and 12 are covered with barrier films 13 and 14 respectively. Examples of the material for the barrier films 13 and 14 include metal materials such as Ta (tantalum) and TaN (tantalum nitride) having barrier properties against diffusion of Cu. The trenches 11 and 12 are filled up with a metal (Cu, for example) containing Cu. Thus, contact wiring 15 and lower wiring 16 are formed in the trenches 11 and 12 respectively. The surfaces of the contact wiring 15 and the lower wiring 16 are generally flush with the surface of the first insulating film 3.

A first interlayer film 5, a second insulating film 6, a second interlayer film 7 and a third insulating film 8 are stacked on the wiring layer 2 in this order from the side closer to the wiring layer 2. Examples of the material for the first and second interlayer films 5 and 7 include SiC (silicon carbide) having barrier properties against diffusion of Cu. Examples of the material for the second and third insulating films 6 and 8 include those identical to the examples of the material for the first insulating film 3.

A capacitor trench 21, an upper wiring trench 22 and via holes 23 and 24 are formed on a multilayer portion formed by the first interlayer film 5, the second insulating film 6, the second interlayer film 7 and the third insulating film 8.

The capacitor trench 21 is formed on a position opposed to the contact wiring 15 in the vertical direction (orthogonal to the surface of the semiconductor substrate), and dug down from the surface of the third insulating film 8 to reach the second insulating film 6.

The upper wiring trench 22 is formed on a position vertically opposed to the lower wiring 16, and dug down from the surface of the third insulating film 8 to reach the second insulating film 6. A proper interval is provided between the upper wiring trench 22 and the capacitor trench 21. Thus, insulation between the upper wiring trench 22 and the capacitor trench 21 is ensured.

The via hole 23 is formed between the contact wiring 15 and the capacitor trench 21, to penetrate the first interlayer film 5 and the second insulating film 6.

The via hole 24 is formed between the lower wiring 16 and the upper wiring trench 22, to penetrate the first interlayer film 5 and the second insulating film 6.

A lower electrode 25 constituted of a metal film of TiN or TaN is formed along the inner surfaces of the capacitor trench 21 and the via hole 23. This lower electrode 25 is in contact with the contact wiring 15 on the bottom surface of the via hole 23. A capacitor film 26 made of a dielectric material such as SiN or $Ta_2O_5$ (tantalum pentoxide) is formed along the surface of the lower electrode 25. Further, a barrier seed film 27 made of Ta or TaN is formed along the surface of the capacitor film 26. An upper electrode 28 is formed on the barrier seed film 27 by filling up the capacitor trench 21 and the via hole 23 with a metal containing copper. Thus, the semiconductor device 1 includes an MIM capacitor formed by sandwiching the capacitor film 26 between the lower electrode 25 and the upper electrode 28.

On the other hand, a metal film 29 made of the same material as that for the lower electrode 25 is formed along the inner surfaces of the upper wiring trench 22 and the via hole 24. This metal film 29 is in contact with the lower wiring 16 on the bottom surface of the via hole 24. Another barrier seed film 30 made of Ta or TaN is formed along the surface of the metal film 29. Upper wiring 31 is formed on the barrier seed film 30 by filling up the upper wiring trench 22 and the via hole 24 with a metal containing copper.

FIGS. 2A to 2E are schematic sectional views showing a method of manufacturing the semiconductor device 1 along the steps.

Figure 2A:
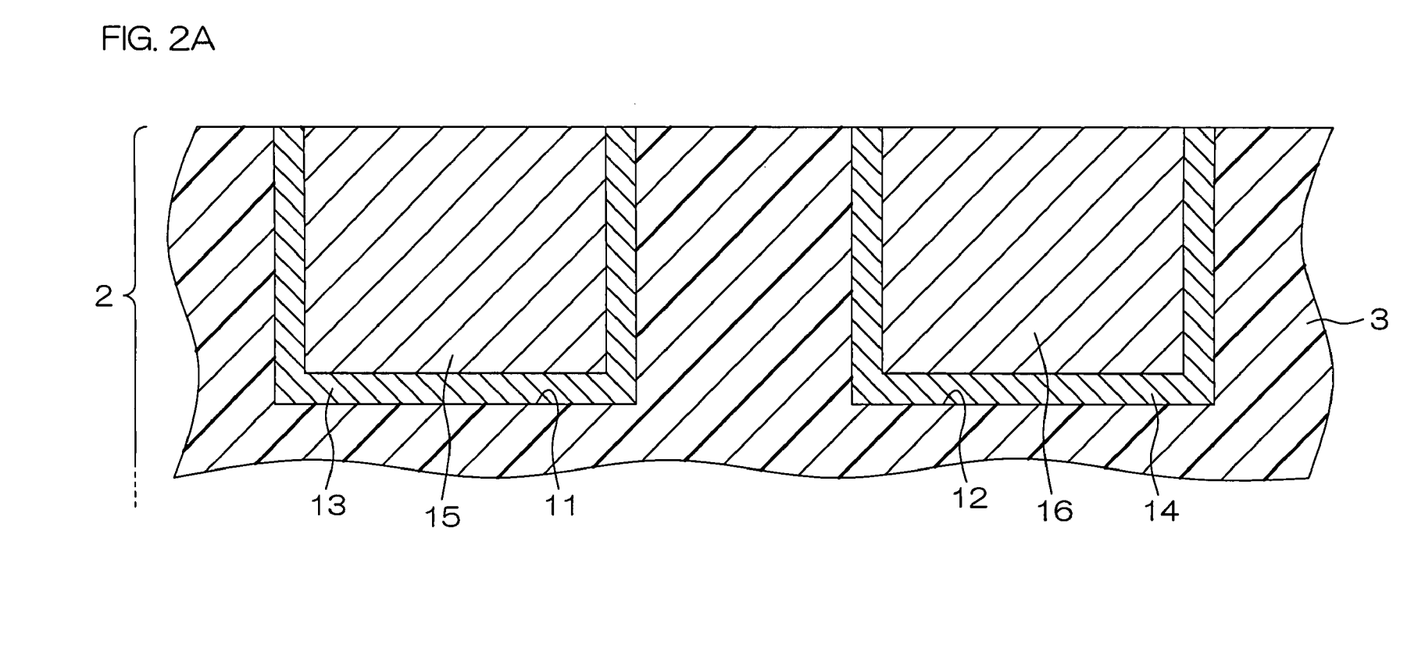
FIG. 2A is a schematic sectional view showing a step of manufacturing the semiconductor device.

First, the semiconductor substrate having the first insulating film 3 on the outermost surface thereof is prepared. Then, the trenches 11 and 12 are formed on the surface of the first insulating film 3 by photolithography and etching, as shown in FIG. 2A. Then, a film made of the material for the barrier films 13 and 14 is formed on the surface of the first insulating film 3 including the inner surfaces of the trenches 11 and 12 by sputtering. Thereafter a plating layer made of the material for the contact wiring 15 and the lower wiring 16 is formed on the film made of the material for the barrier films 13 and 14 by plating. This plating layer is formed in such a thickness as to fill up the trenches 11 and 12. Then, the film made of the material for the barrier films 13 and 14 and the plating layer are polished by CMP (Chemical Mechanical Polishing), and portions of the film and the plating layer outside the trenches 11 and 12 are removed. Thus, the surface of the first insulating film 3 is exposed, and the barrier films 13 and 14 are obtained, while the contact wiring 15 and the lower wiring 16 having the surfaces generally flush with the surface of the first insulating film 3 are obtained.

Figure 2B:
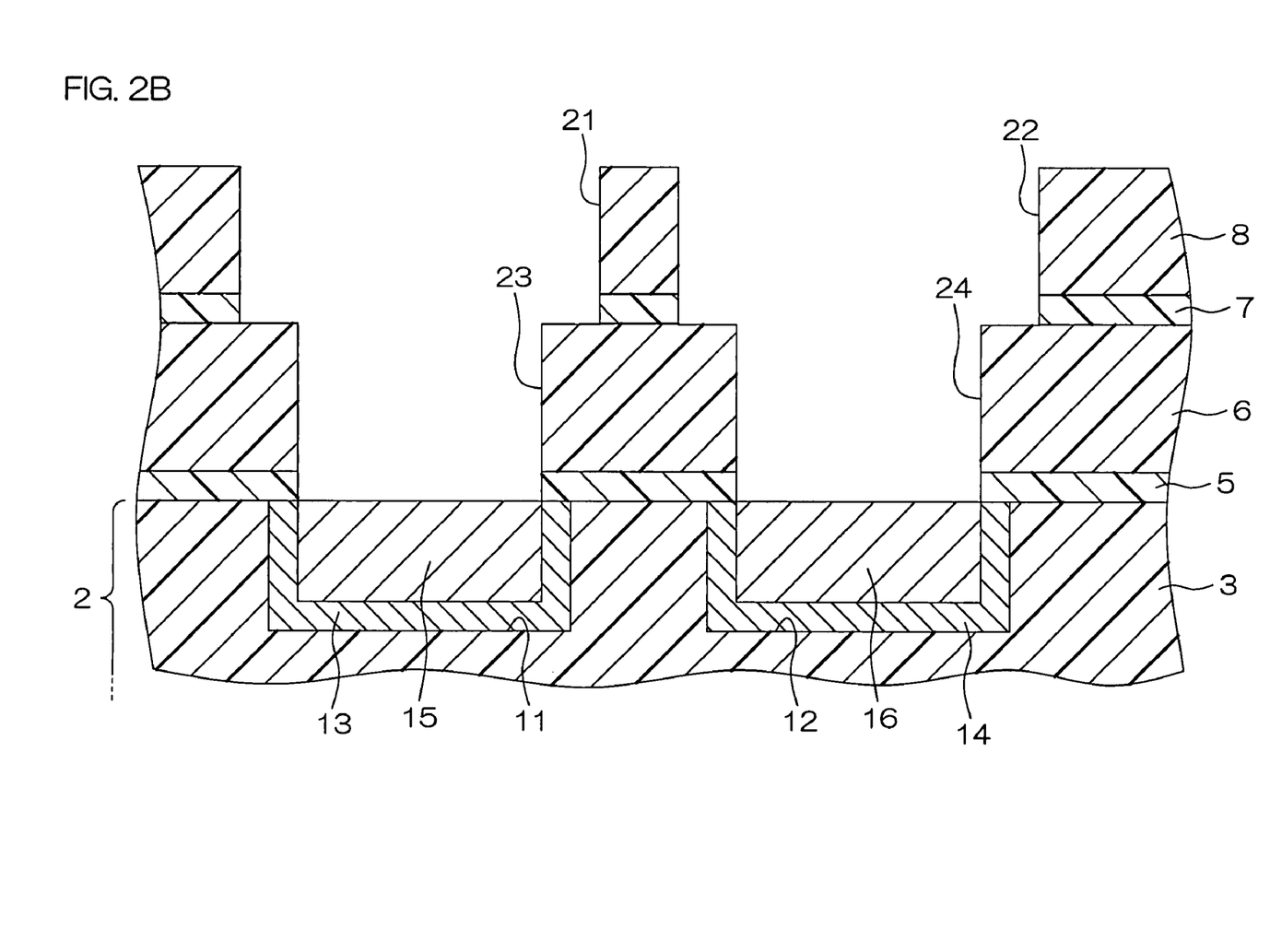
FIG. 2B is a schematic sectional view showing the next step of FIG. 2A.

Then, the first interlayer film 5, the second insulating film 6, the second interlayer film 7 and the third insulating film 8 are stacked on the first insulating film 3 (wiring layer 2) in this order by CVD (Chemical Vapor Deposition), as shown in FIG. 2B. Then, photolithography and etching are repeated so that the capacitor trench 21, the upper wiring trench 22 and the via holes 23 and 24 are formed in the multilayer portion constituted of the first interlayer film 5, the second insulating film 6, the second interlayer film 7 and the third insulating film 8.

Figure 2C:
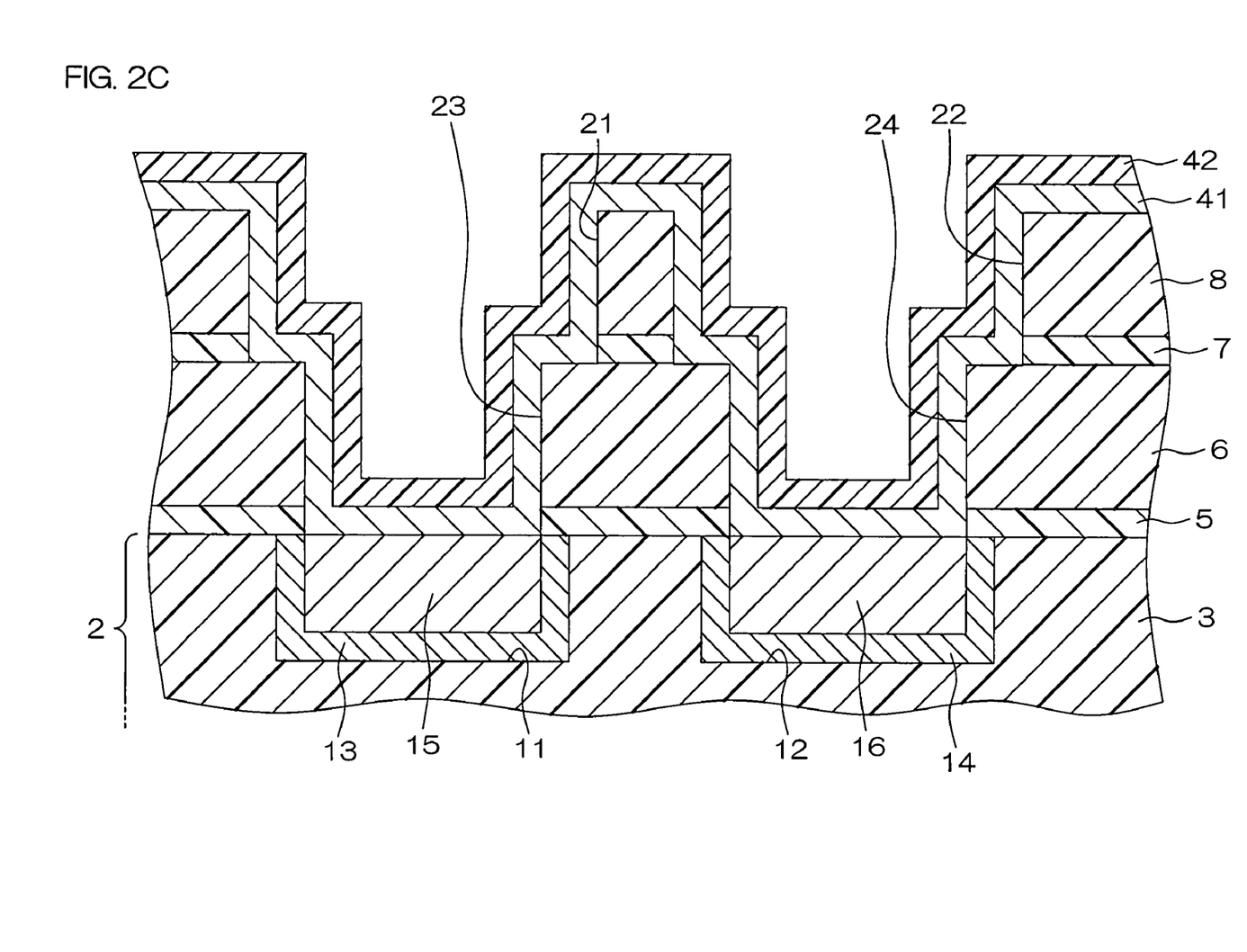
FIG. 2C is a schematic sectional view showing the next step of FIG. 2B.

Thereafter a film 41 made of the material for the lower electrode 25 is formed on the surface of the third insulating film 8 and the inner surfaces of the capacitor trench 21, the upper wiring trench 22 and the via holes 23 and 24 to cover the entire regions thereof, as shown in FIG. 2C. Another film 42 made of the material for the capacitor film 26 is formed on the electrode material film 41, to cover the entire region thereof. These films 41 and 42 can be formed by sputtering, for example.

Figure 2D:
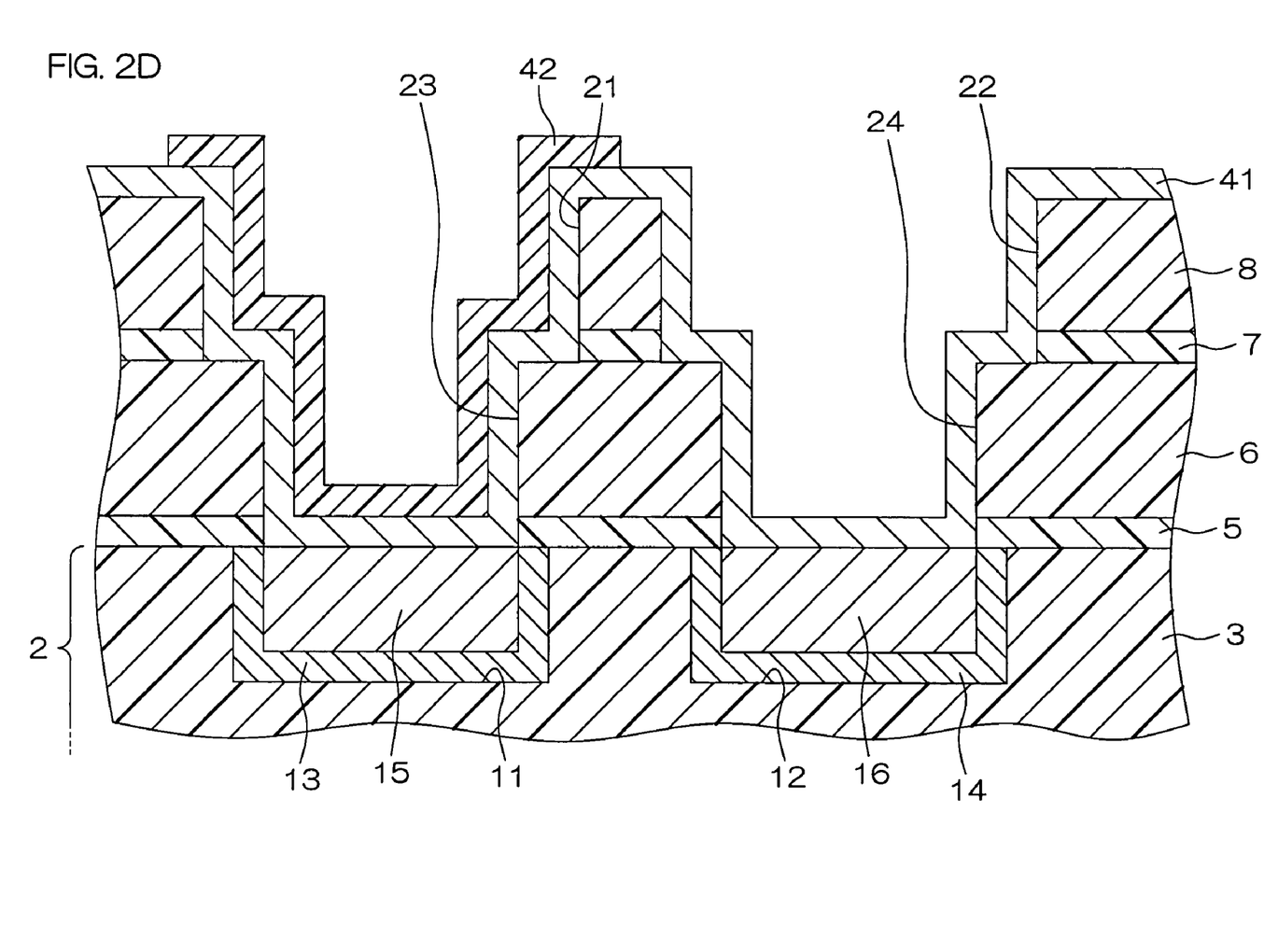
FIG. 2D is a schematic sectional view showing the next step of FIG. 2C.

Then, a resist film (not shown) having an opening pattern covering the capacitor trench 21 and the vicinity thereof while exposing the remaining portion is formed on the film 42. This resist film is employed as a mask for etching the film 42, thereby partially leaving the film 42 only on the capacitor trench 21 and the vicinity thereof and removing the remaining portion of the film 42, as shown in FIG. 2D.

Figure 2E:
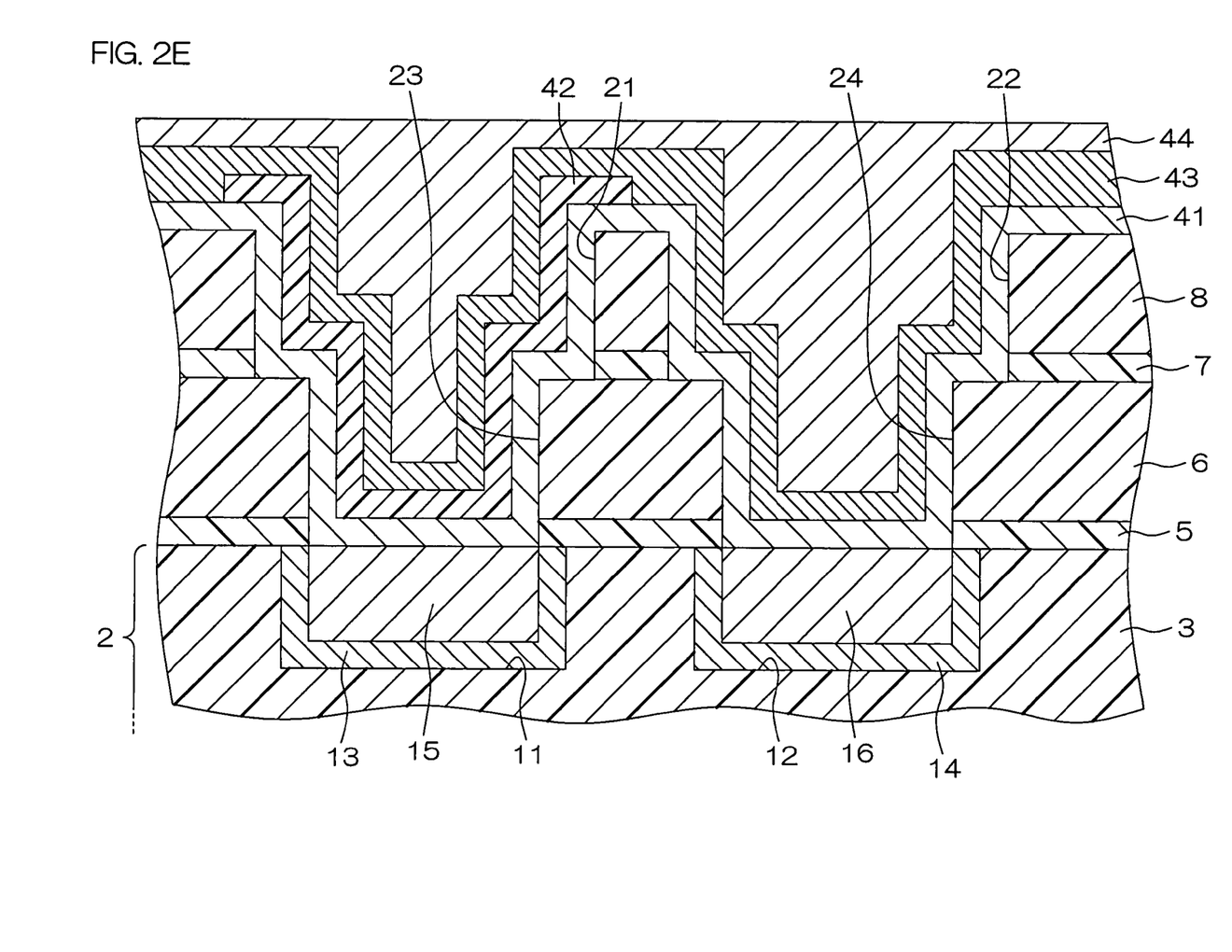
FIG. 2E is a schematic sectional view showing the next step of FIG. 2D.

Thereafter a seed film 43 made of the material for the barrier seed films 27 and 30 is formed to entirely cover the surfaces of the films 41 and 42 by sputtering, as shown in FIG. 2E. Further, a plating layer 44 made of the material for the upper electrode 28 and the upper wiring 31 is formed on the seed film 43 by electrolytic plating utilizing the seed film 43 as the seed. This plating layer 44 is formed in such a thickness as to fill up the capacitor trench 21, the upper wiring trench 22 and the via holes 23 and 24. Then, the films 41 and 42, the seed film 43 and the plating layer 44 are polished by CMP, so that portions of these films 41, 42 and 43 outside the capacitor trench 21 and the upper wiring trench 22 are removed. Thus, the surface of the third insulating film 8 is exposed, the lower electrode 25, the capacitor film 26, the barrier seed film 27 and the upper electrode 28 are formed in the capacitor trench 21, and the metal film 29, the barrier seed film 30 and the upper wiring 31 are formed in the upper wiring trench 22, so that the semiconductor device 1 shown in FIG. 1 is obtained.

In this semiconductor device 1, the capacitor trench 21 is formed to reach the second insulating film 6 from the surface of the third insulating film 8. The film-shaped lower electrode 25 is formed along the inner surface of the capacitor trench 21, and the capacitor film 26 is formed along the surface of the lower electrode 25. The upper electrode 28 opposed to the lower electrode 25 with the capacitor film 26 sandwiched therebetween is provided on the capacitor film 26. Thus, the semiconductor device 1 includes the MIM capacitor formed by sandwiching the capacitor film 26 between the lower electrode 25 and the upper electrode 28.

In this MIM capacitor, the lower electrode 25 and the capacitor film 26 are formed along the inner surface of the capacitor trench 21, and the area (opposed area) of the opposed portions of the lower electrode 25 and the upper electrode 28 are larger than the area occupied by the capacitor trench 21. As compared with an MIM capacitor including a lower electrode and an upper electrode in the form of parallel flat plates, therefore, the same capacitance can be ensured with a smaller occupied area (plane size). Therefore, the area occupied by the MIM capacitor can be reduced in the semiconductor device.

While the present invention has been described in detail by way of the embodiments thereof, it should be understood that these embodiments are merely illustrative of the technical principles of the present invention and not limitative of the invention. The spirit and scope of the present invention are to be limited only by the appended claims.

This application corresponds to Japanese Patent Application No. 2007-145810 filed with the Japanese Patent Office on May 31, 2007, the disclosure of which is incorporated herein by reference.

What is claimed is:

1. A semiconductor device, comprising:
   a wiring layer including a surface layer portion;
   a first wiring embedded in the surface layer portion;
   an insulating layer stacked on the wiring layer;
   a first trench extending into the insulating layer from a surface thereof;
   a film-shaped lower electrode formed along an inner surface of the first trench;
   a capacitor film formed along a surface of the lower electrode;
   an upper electrode filling the first trench and opposed to the lower electrode with the capacitor film sandwiched therebetween;
   a second trench extending into the insulating layer from the surface thereof;
   a metal film, made of the same material as the lower electrode, formed along an inner surface of the second trench;
   a second wiring filling the second trench;
   a first barrier seed film sandwiched between the upper electrode and the capacitor film; and
   a second barrier seed film, made of the same material as the first barrier seed film, sandwiched between the second wiring and the metal film, the second barrier seed film being in direct contact with the second wiring and the metal film.

2. The semiconductor device according to claim 1, wherein the first wiring is embedded in the surface layer portion of the wiring layer, on a position opposed to the first trench, the insulating layer includes a via hole penetrating between a bottom surface of the first trench and a surface of the first wiring, and
   the lower electrode is formed along the inner surface of the first trench, a side surface of the via hole and a portion of a surface of the first wiring faces the first trench.

3. The semiconductor device according to claim 1, wherein the upper electrode is made of a metal containing copper.

4. The semiconductor device according to claim 1, wherein the wiring layer includes a third wiring embedded in the surface layer portion thereof, and
   the third wiring is connected to the second wiring.

5. The semiconductor device according to claim 1, wherein the lower electrode is made of TiN or TaN.

6. The semiconductor device according to claim 1, wherein the capacitor film is made of SiN or $Ta_2O_5$.

7. The semiconductor device according to claim 4, wherein the first and third wirings are covered with a barrier metal.

8. The semiconductor device according to claim 7, wherein the barrier metal is Ta or TaN.

9. The semiconductor device according to claim 3, wherein the second wiring is made of a metal containing copper.

10. The semiconductor device according to claim 1, wherein the first trench has a height substantially equal to a height of the second trench.

11. The semiconductor device according to claim 1, wherein the first trench has a width substantially equal to a width of the second trench, each of the first and second widths being measured through a cross-section of the semiconductor device.

12. The semiconductor device according to claim 4, wherein when viewing a cross section of the semiconductor device, the first wiring and the third wiring are separate from each other.

13. The semiconductor device according to claim 4, wherein the first wiring has a width that is substantially the same as a width of the third wiring.

14. A method of manufacturing a semiconductor device, comprising the steps of:
  stacking an insulating layer on a wiring layer, the wiring layer having a contact wiring and a lower wiring, each being embedded in a surface layer portion of the wiring layer;
  forming a first trench and a second trench on a position opposed to the contact wiring and a position opposed to the lower wiring respectively by etching the insulating layer from a surface thereof;
  forming a metal film on inner surfaces of the first trench and the second trench and a surface of the insulating layer after forming the first and second trenches;
  forming a capacitor film at least on the metal film in the first trench;
  forming a barrier seed film on the capacitor film in the first trench and on the metal film in the second trench so that the barrier seed film is in direct contact with the metal film in the second trench;
  forming a conductive material layer by depositing a conductive material on the barrier seed film to fill the first trench and the second trench; and
  removing portions of the conductive material layer and the metal film outside the first trench and the second trench.

15. The method of manufacturing a semiconductor device according to claim 14, further wherein the capacitor film is formed so that the second trench is exposed therefrom.

16. The method of manufacturing a semiconductor device according to claim 14, further wherein during the step of forming the capacitor film, the capacitor film is formed in the second trench, and the method further includes the step of exposing the metal film in the second trench by removing the capacitor film formed in the second trench.

* * * * *